United States Patent
Horie (10) Patent No.: US 9,892,969 B2
(45) Date of Patent: Feb. 13, 2018

(54) PROCESS OF FORMING AN ELECTRONIC DEVICE

(71) Applicant: SEMICONDUCTOR COMPONENTS INDUSTRIES, LLC, Phoenix, AZ (US)

(72) Inventor: Takumi Horie, Ojiya (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/151,791

(22) Filed: May 11, 2016

(65) Prior Publication Data

US 2017/0330798 A1 Nov. 16, 2017

(51) Int. Cl.
*H01L 21/306* (2006.01)
*H01L 21/768* (2006.01)
*H01L 21/311* (2006.01)

(52) U.S. Cl.
CPC .. *H01L 21/76898* (2013.01); *H01L 21/30604* (2013.01); *H01L 21/31111* (2013.01); *H01L 21/31144* (2013.01); *H01L 21/76819* (2013.01); *H01L 21/76831* (2013.01)

(58) Field of Classification Search
CPC ......... H01L 21/76898; H01L 21/30604; H01L 21/31111; H01L 21/31144; H01L 21/76819; H01L 21/76831
See application file for complete search history.

(56) References Cited

U.S. PATENT DOCUMENTS

| 8,492,260 | B2 | 7/2013 | Parsey, Jr. et al. |
| 8,981,533 | B2 | 3/2015 | Grivna |
| 9,117,802 | B2 | 8/2015 | Parsey, Jr. et al. |
| 2007/0281474 | A1 | 12/2007 | Suzuki et al. |
| 2008/0286978 | A1* | 11/2008 | Chen ................. H01L 21/30655 438/713 |
| 2010/0055400 | A1* | 3/2010 | Farr ....................... H01J 37/321 428/156 |
| 2011/0207323 | A1* | 8/2011 | Ditizio ................ B81C 1/00087 438/675 |
| 2014/0264574 | A1 | 9/2014 | Loechelt et al. |
| 2015/0221549 | A1* | 8/2015 | Ponoth .............. H01L 21/76843 438/643 |

FOREIGN PATENT DOCUMENTS

| JP | 2013206991 A | 10/2013 |
| JP | 2014013821 A | 1/2014 |

* cited by examiner

*Primary Examiner* — Nadine Norton
*Assistant Examiner* — Mahmoud Dahimene
(74) *Attorney, Agent, or Firm* — Abel Law Group, LLP (57) ABSTRACT

A process of forming an electronic device includes providing a substrate having a major surface; etching a portion of a the substrate to define a trench extending from the major surface, wherein the portion of the trench has a first width, $W_1$, along the major surface and a second width, $W_2$, at a bottom of the portion of the trench, and wherein the first width is greater than the second width; depositing a protective layer along side surfaces of the portion of the trench; etching the substrate to extend a depth of the trench after depositing the protective layer; and removing the protective layer.

19 Claims, 5 Drawing Sheets

PROCESS OF FORMING AN ELECTRONIC DEVICE

FIELD OF THE DISCLOSURE

The present disclosure relates to processes associated with forming electronic devices, and more particularly to processes for forming trench structures in electronic devices.

RELATED ART

Figure 1:
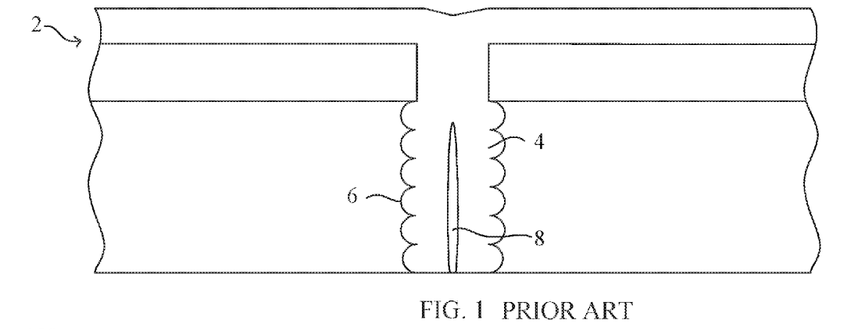
FIG. 1 includes a cross-sectional illustration of a workpiece formed using a prior art trench forming technique.

Trenches are used in electronic devices to control electrical fields between adjacent semiconductor device components, forming through-substrate vias and the like. Deep trenches extending into a semiconductor substrate typically include scalloped sidewalls as a result of standard etching processes, such as the Bosch process. The scalloped sidewalls can have portions with widths greater than the width of the opening along the major surface of the semiconductor substrate. As a result, voids can form in material deposited in the trench, creating undesirable electrical characteristics in the electronic device. FIG. 1 illustrates a prior art electronic device 2 formed using conventional Bosch processes. As illustrated, material 4 deposited in the trench 6 has internal voids 8 resulting from material flowing to occupy the scalloped features of the trench 6. This can result in undesirable electrical characteristics of the finished electronic device.

Industries continue to demand improved processes for forming electronic devices with desired electrical characteristics.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Electronic devices can be formed using processes described in accordance with embodiments herein. In a particular aspect, an electronic device can be formed by etching a portion of substrate to define a trench extending from a major surface of the substrate. The portion of the trench can have a first width, as measured along the major surface, and a second width at a bottom of the portion of the trench. The first width is greater than the second width. A protective layer can be deposited along side surface of the portion of the trench. The substrate can then be etched to extend a depth of the trench. In an embodiment, etching can be performed by alternating between etching the substrate and depositing polymer into the trench. After etching is complete, the protective layer can be removed and the inner wall of the trench can be smoothed to form a deep trench.

In another aspect, an electronic device can be formed by forming a patterned masking layer over a substrate, the patterned masking layer defining an opening have a first width. The substrate can be etched through the opening of the masking layer by alternating between depositing polymer into the formed trench and further etching the trench to extend a depth thereof. The opening in the masking layer can then be widened and the inner surface of the trench smoothed.

In yet another aspect, an electronic device can be formed by forming a patterned masking layer defining an opening on a substrate. A sidewall spacer can be positioned within the opening. The substrate can be etched through the opening of the masking layer by alternately depositing polymer into the formed trench and further etching the trench to extend a depth thereof. The sidewall spacer can then be removed and the inner surface of the trench smoothed.

In accordance with embodiments herein, trenches can be formed to have final depths of at least 11 microns, at least 12 microns, at least 13 microns, at least 14 microns, or at least 15 microns while having generally uniform cross sections and smooth, or generally smooth, inner side surfaces.

Figure 2:
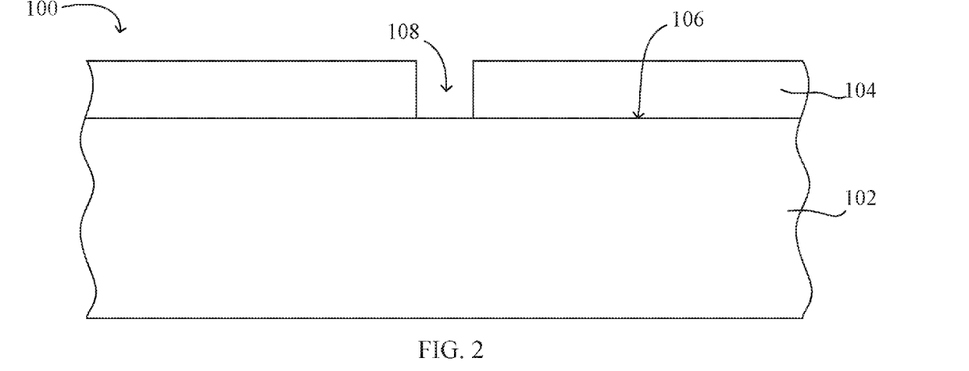
FIG. 2 includes a cross-sectional illustration of a portion of a workpiece including a substrate and a masking layer.

FIG. 2 illustrates a cross-sectional view of a workpiece 100 including a substrate 102, such as a semiconductor layer, and a masking layer 104 disposed on a major surface 106 of the substrate 102. The masking layer 104 can be patterned on the major surface 106 and can include an insulation film, such as for example, a silicon oxide film, a silicon nitride film, a photoresist, or any combination thereof. The masking layer 104 can define an opening 108 extending to the major surface 106 of the substrate 102.

The substrate 102 can include features such as, for example, doped regions, well regions, channel regions, implants, oxides, masking layers, insulative layers, junctions, diodes, gate electrodes, signal lines, or any combination thereof. In an embodiment, at least one of the features can be formed in the substrate 102 prior to formation of a trench 200 (FIG. 2). In another embodiment, at least one of the features can be formed after at least partially forming the trench 200. In yet a further embodiment, at least one of the features can be formed in the substrate 102 during formation of the trench 200.

Figure 3:
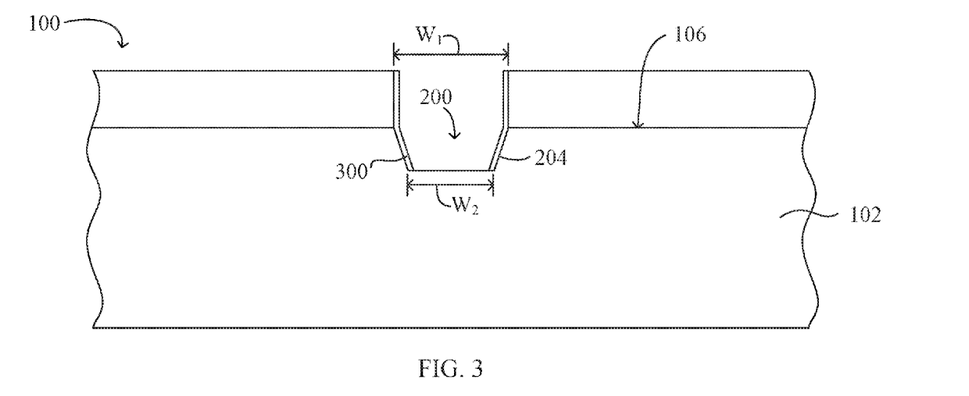
FIG. 3 includes a cross-sectional illustration of the workpiece of FIG. 2 after forming a portion of a trench.

Referring to FIG. 3, a portion of the substrate 102 can be etched from the major surface 106 to define a portion of a trench 200. As illustrated in FIG. 2, the portion 200 is aligned with the opening 108. In an embodiment, etching the portion of the trench 200 can be performed using a plasma etch process including $SF_6$ gas, $C_4F_8$ gas, or a mixture thereof. In a particular embodiment, the etching gas can have a pressure in a range of approximately 8 mTorr and 20 mTorr with a gas flow rate in a range of approximately 20 sccm and 40 sccm. Etching gas can be supplied at a voltage in a range of approximately 300 V to 400 V and a power density in a range of 1.0 W/cm$^2$ and 2.0 W/cm$^2$ for a period of time between 5 seconds and 10 seconds.

In an embodiment, formation of the portion 200 can further include deposition of a protective layer 300 along a side surface 204 of the portion 200. In an embodiment, the protective layer 300 can include a material resistant to the etchant, such as a polymer. In a particular embodiment, deposition of the protective layer 300 during formation of the portion 200 is performed at a pressure in a range of approximately 10 mTorr and 20 mTorr with a gas flow rate in a range of approximately 120 sccm and 190 sccm. In an embodiment, deposition is performed at a voltage in a range of 1 V and 20 V and a power density in a range of 1.0 W/cm$^2$ and 2.0 W/cm$^2$ for a period of time between 1 second and 4 seconds. The process of etching the substrate 102 and depositing the protective layer 300 along the side surface 204 of the portion 200 can be alternately repeated until the portion 200 reaches a desired depth.

The resulting portion 200 has a first width, as measured along the major surface 106, and a second width, as measured at a bottom 202 of the portion 200. In an embodiment, the first width, $W_1$, is greater than the second width $W_2$. For example, $W_1$ can be at least 1.001 $W_2$, at least 1.01 $W_2$, at least 1.05 $W_2$, at least 1.1 $W_2$, or at least 1.2 $W_2$. In another embodiment, $W_1$ is no greater than 2 $W_2$, no greater than 1.75 $W_2$, or no greater than 1.5 $W_2$. In a further embodiment, $W_1$ can be in a range between and including 1.001 $W_2$ and 2.0 $W_2$, in a range between and including 1.01 $W_2$ and 1.5 $W_2$, in a range between and including 1.05 $W_2$ and 1.4 $W_2$, or in a range between and including 1.1 $W_2$ and 1.2 $W_2$.

The portion 200 can have a generally tapered profile, as viewed in cross section. In an embodiment, the portion 200 tapers linearly such that the side surface 204 of the portion 200 lies along a generally straight line, as viewed in cross section. In another embodiment, the portion 200 can taper artcuately such that the side surface 204 of the portion 200 lies along an arcuate line, as viewed in cross section. The artcuately tapered side surface 204 can convex or concave. In a further embodiment, the portion 200 can taper both linearly and artcuately, having both linear and arcuate portions.

Figure 4:
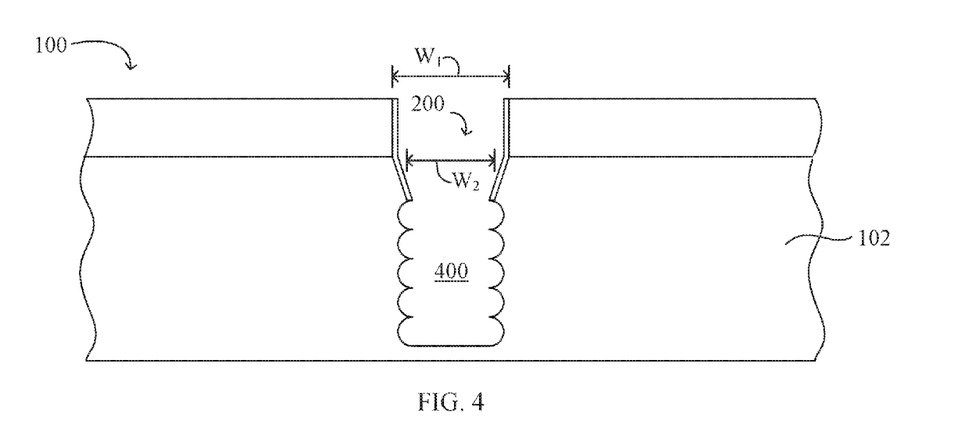
FIG. 4 includes a cross-sectional illustration of the workpiece of FIG. 3 after etching the substrate to extend a depth of the trench.

After the portion 200 is formed and the protective layer 300 covers the side surface 204 of the portion 200, a trench can be formed into the substrate 102. FIG. 4 illustrates the workpiece 100 after etching the substrate 102 to extend a depth of the portion 200 to form a trench 400.

In an embodiment, etching the trench 400 is performed by alternating between etching the substrate 102 and depositing polymer into the trench 400. Etching the substrate 102 can be performed isotropically. In an embodiment, etching is performed using a halogen-containing gas, and in an embodiment, the halogen-containing gas does not include hydrogen. In a particular embodiment, the halogen-containing gas can include $SF_6$, $CF_4$, $NF_3$, or a mixture thereof. If needed or desired, a diluent gas, such as a noble gas, may be used. In a particular embodiment Ar gas may be used.

In a particular embodiment, etching is performed at a pressure in a range of approximately 30 mTorr and 50 mTorr and a gas flow rate in a range of 160 sccm and 220 sccm. In an embodiment, etching can be performed a voltage in a range of 400 V to 450 V and a power density in a range of 1.5 W/cm$^2$ to 4 W/cm$^2$. Each etching step can be performed for a period of time in a range between and including 1 second and 5 seconds, in a range between and including 1 second and 3 seconds, or in a range between and including 1 second and 1.5 seconds.

In an embodiment, deposition of polymer into the trench 400 is performed using an unsaturated carbon-containing gas. A partially or fully fluorinated (perfluoro) compound may be used. In a particular embodiment $C_4F_8$ gas, $C_3F_6$ gas, or a mixture thereof, may be used. When the mask layer 102 includes photoresist, a hydrogen-containing gas may be used. An example includes $CHF_3$, $CH_3F$, or the like. If needed or desired, a diluent gas, such as a noble gas, may be used. In a particular embodiment Ar may be used. In a more particular embodiment, deposition is performed at a pressure in a range of approximately 20 mTorr and 40 mTorr and a gas flow rate in a range of 120 sccm and 150 sccm. In a particular embodiment, deposition can be performed at a voltage in a range of approximately 5 V and 15 V and a power density in a range of approximately 1.5 W/cm$^2$ to 4 W/cm2. Each deposition step can be performed for a period of time in a range between and including 1 second and 5 seconds, in a range between and including 1 second and 3 seconds, or in a range between and including 1.5 seconds and 2 seconds.

Formation of the trench 400 can be performed by repeating the etching and deposition steps described above in successive cycles. In an embodiment, forming the trench requires at least 5 cycles, at least 10 cycles, at least 25 cycles, or at least 50 cycles. In another embodiment, forming the trench 400 requires less than 500 cycles, less than 200 cycles, or less than 75 cycles. The number of cycles required to form the trench 400 can depend on the etching gas and etching parameters, as well as the required depth of the trench 400 and substrate composition.

After forming the trench 400 to a desired depth, the resulting side surface 204 has scalloped features with minimum widths approximately corresponding to the second width, $W_2$, of the portion 200 and maximum widths approximately corresponding to the first width, $W_1$, of the portion 200. In a particular embodiment, step height of the scalloped features is in a range between and including 3000 Å and 9000 Å, in a range between and including 4000 Å and 8000 Å, in a range between and including 5000 Å and 7000 Å, or in a range between and including 5500 Å and 6500 Å. In a particular instance, the step height of the scalloped features is approximately 6000 Å. The step height of the scallops is largely dependent on the side etching of $SF_6$ gas increases. The scallops in FIG. 4 are illustrated exaggerated in shape and size for understanding.

Figure 5:
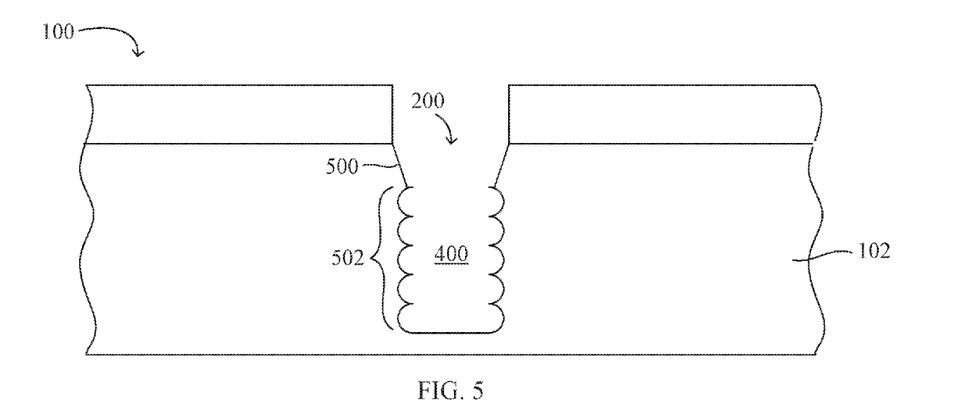
FIG. 5 includes a cross-sectional illustration of the workpiece of FIG. 4 after removing the protective layer from the portion of the trench.

Referring to FIG. 5, after forming the trench 400 to a desired depth, the protective layer 300 (FIG. 3) is removed. In an embodiment, the protective layer 300 can be removed using an etching process, such as a plasma etch. In a particular embodiment, $O_2$ plasma can be used to remove the protective layer 300 from the portion 200 of the trench 400. In another particular embodiment, the $O_2$ plasma etch is performed at a pressure in a range of approximately 10 mTorr and 20 mTorr and a gas flow rate in a range of approximately 30 sccm and 240 sccm. The $O_2$ plasma etch can be performed at a voltage in a range of approximately 100 V to 200 V with a power density in a range of approximately 1.5 W/cm$^2$ and 2.5 W/cm$^2$. The resulting trench 400 can have a tapered upper portion 500 and a scalloped lower portion 502. The maximum width of the scalloped lower portion 502 can be approximately equal to or less than the first width, $W_1$, of the portion 200.

Figure 6:
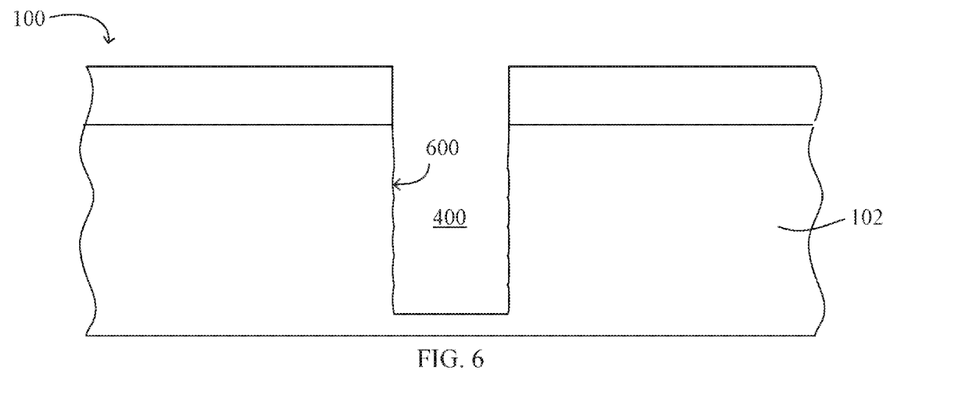
FIG. 6 includes a cross-sectional illustration of the workpiece of FIG. 5 after smoothing an inner wall of the trench.

FIG. 6 illustrates a cross-sectional view of the workpiece 100 after smoothing the side surface 600 of the trench 400. Smoothing of the side surface 600 can be performed anisotropically, etching the innermost tips of the scalloped features. In an embodiment, smoothing the side surface 600 can be achieved using an anisotropic etch. As compared to the isotropic etch when deepening the trench, the etch is performed at a lower pressure than etching the substrate 102 to extend the trench 400. In another embodiment, smoothing the side surface 600 is performed at a higher voltage than etching the substrate 102 to extend the trench 400. In a further embodiment, smoothing the side surface 600 is performed at a higher voltage and a lower pressure than etching the substrate 102 to extend the trench 400. In a particular embodiment, smoothing the inner surface can be performed using a plasma etch process including $SF_6$ gas, $C_4F_8$ gas, or a mixture thereof. In a particular embodiment, the etching gas can have a pressure in a range of approximately 5 mTorr and 10 mTorr with a gas flow rate in a range of approximately 20 sccm and 100 sccm. In an embodiment, etching gas can be supplied at a voltage in a range of approximately 400 V to 500 V and a power density in a range of 1.0 W/cm$^2$ and 2.0 W/cm$^2$ for a period of time between 10 seconds and 30 seconds.

As illustrated, smoothing the side surface 600 of the trench 400 can result in a more uniform trench 400 than otherwise possible using a traditional Bosch deep trench forming process. Bosch deep trench formation processes typically create tapered trenches with widths different from the width of the masking layer opening through which the trench was formed.

Figure 7:
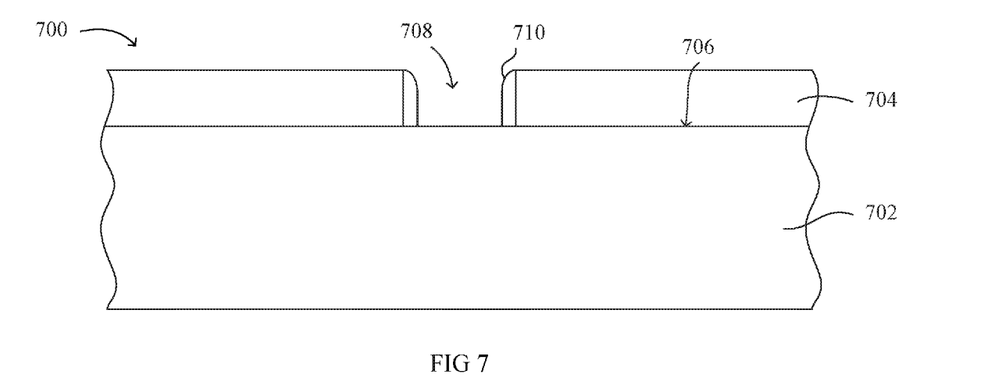
FIG. 7 includes a cross-sectional illustration of a portion of another workpiece including a substrate, a masking layer, and sidewall spacers.

In another aspect, formation of a trench is performed using a sidewall spacer. FIG. 7 illustrates another process of forming an electronic device in a workpiece 700. The initial step includes providing a substrate 702, such as a semiconductor layer, and a masking layer 704 disposed on a major surface 706 of the substrate 702. The masking layer 704 can be patterned to expose the major surface 706 and can include an insulation film, such as for example, a silicon oxide film, a silicon nitride film, a photoresist, or any combination thereof. The masking layer 704 can define an opening 708 extending through the masking layer 704 to the major surface 706 of the substrate 702. A sidewall spacer 710 can be disposed in the opening 708 along the periphery thereof. In an embodiment, the sidewall spacer 710 can include a same material as the masking layer 704. In another embodiment, the sidewall spacer 710 can be formed from a material different than the material of the masking layer 704. For example, in a particular embodiment, the masking layer 704 can be formed from a silicon oxide and the sidewall spacer 710 can be formed from a silicon nitride.

As illustrated, the width of the opening 708 can be greater than the width of the opening in the sidewall spacer 710. For example, the width of the opening 708 can be at least 1.001 times greater than the width of the opening in the sidewall spacer 710, as measured at a base of the sidewall spacer 710, at least 1.01 times greater than the width of the opening in the sidewall spacer 710, or at least 1.1 times greater than the width of the opening on the sidewall spacer 710. In another embodiment, the width of the opening 708 is no greater than 2.0 times greater than the width of the opening in the sidewall spacer 710.

Figure 8:
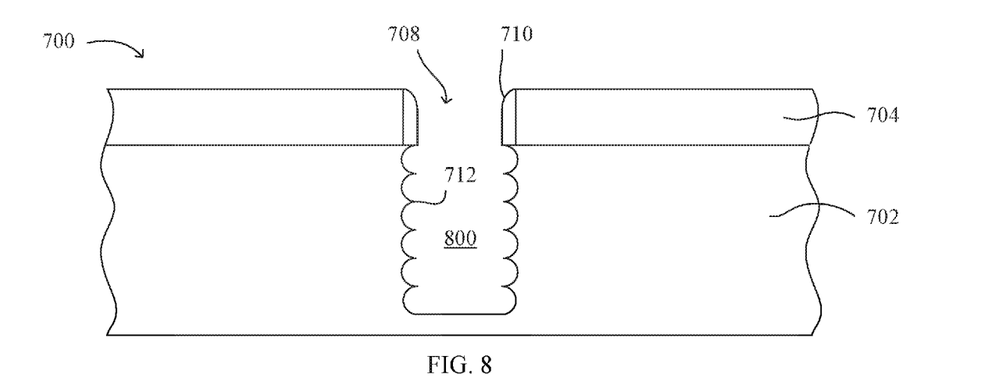
FIG. 8 includes a cross-sectional illustration of the workpiece of FIG. 7 after alternately etching and depositing polymer into the substrate to form a trench.

Referring to FIG. 8, after formation of the sidewall spacer 710, a trench 800 can be etched into the substrate 702 by alternately etching the substrate 702 and depositing polymer into the trench 800. Forming the trench 800 can be performed using a same, or similar, process as previously described. For example, etching the substrate 702 can be performed isotropically using an $SF_6/C_4F_8$ mixture. Etching can occur at a pressure in a range of approximately 30 mTorr and 50 mTorr and a gas flow rate in a range of approximately 170 sccm and 210 sccm. Each etching step can occur for a period of time in a range between and including 1 second and 5 seconds, in a range of approximately 1 second and 3 seconds, or in a range of approximately 1 second and 1.5 seconds.

Deposition of polymer into the trench 800 can be performed with an unsaturated carbon-containing gas. A partially or fully fluorinated (perfluoro) compound may be used. In a particular embodiment $C_4F_8$ gas, $C_3F_6$ gas, or a mixture thereof may be used. When the masking layer 704 includes photoresist, a hydrogen-containing gas may be used. An example includes $CHF_3$, $CH_3F$, or the like. If needed or desired, a diluent gas, such as a noble gas may be used. In a particular embodiment, Ar may be used.

In a more particular embodiment, deposition is performed at a pressure in a range of approximately 20 mTorr and 40 mTorr and a gas flow rate in a range of approximately 120 sccm and 150 sccm. Each deposition step can be performed for a period of time in a range of approximately 1 second and 5 seconds, in a range of approximately 1 second and 3 seconds, or in a range of approximately 1.5 seconds and 2 seconds. Formation of the trench 800 can occur by repeating the etching and deposition steps described above in successive cycles. In an embodiment, forming the trench 800 requires at least 5 cycles, at least 10 cycles, at least 25 cycles, or at least 50 cycles. In another embodiment, forming the trench 800 requires less than 500 cycles, less than 200 cycles, or less than 75 cycles The resulting trench 800 has a scalloped side surface 712 similar to the side surface 502 discussed above. For example, in an embodiment, step height of the scalloped features is in a range between and including 3000 Å and 9000 Å, in a range between and including 4000 Å and 8000 Å, in a range between and including 5000 Å and 7000 Å, or in a range between and including 5500 Å and 6500 Å.

In an embodiment, the sidewall spacer 710 extends over the scalloped side surface 712 such that from a top view the scalloped features are not visible. As illustrated in FIG. 8, the scalloped features each have a minimum width roughly corresponding to an innermost diameter formed by the sidewall spacer 710 and a maximum width roughly corresponding to the diameter of the opening 708 in the masking layer 704.

Figure 9:
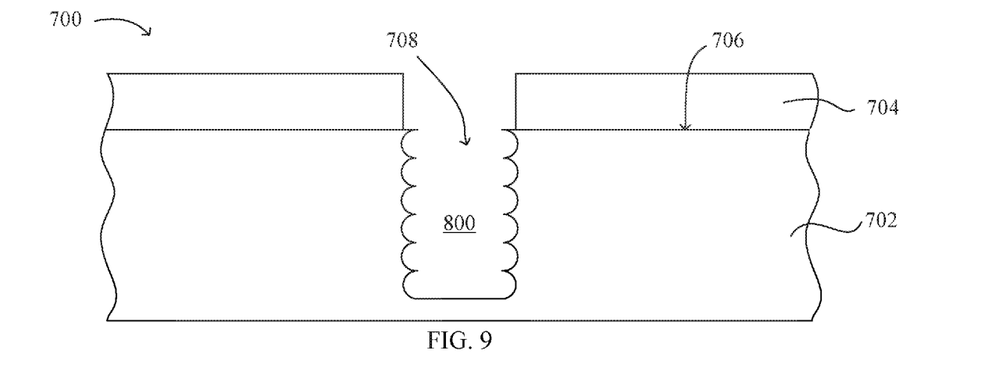
FIG. 9 includes a cross-sectional illustration of the workpiece of FIG. 8 after removing the sidewall spacers.

Referring to FIG. 9, after formation of the trench 800, the sidewall spacer 710 is removed, leaving the masking layer 704 overlying the substrate 702. In a particular instance, the sidewall spacer 710 can be removed using an etching process including, for example, a $H_3PO_4$ solution. In an embodiment, the sidewall spacer 710 is formed from a silicon nitride. In another embodiment, the sidewall spacer 710 is a silicon oxide, removable by HF solution. As illustrated, the width of the substrate 702 along the major surface 706 is less than the width of the opening 708 of the masking layer 704.

Figure 10:
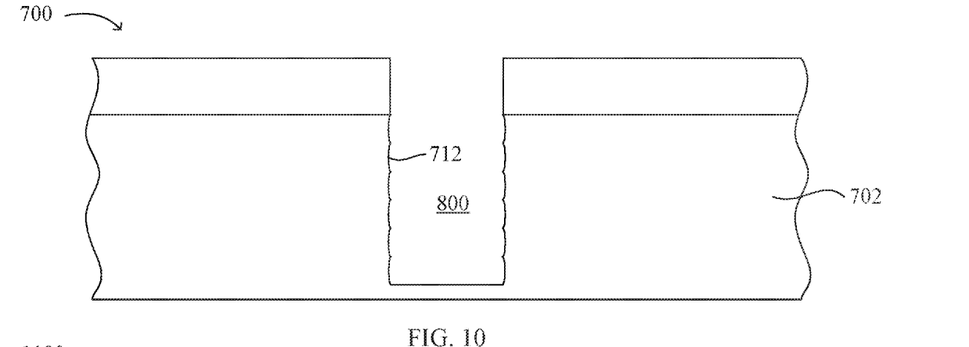
FIG. 10 includes a cross-sectional illustration of the workpiece of FIG. 9 after smoothing an inner wall of the trench.

FIG. 10 illustrates a cross-sectional view of the electronic device 700 after smoothing the inner surface 712 of the trench 800. Smoothing of the inner surface 712 can be performed anisotropically, etching the innermost tips of the scalloped features. In an embodiment, smoothing the inner surface 712 occurs at a lower pressure than etching the substrate 702 to extend the trench 800. In another embodiment, smoothing the inner surface 712 occurs at a higher voltage than etching the substrate 702 to extend the trench 800. In a further embodiment, smoothing the inner surface 712 occurs at a higher voltage and a lower pressure than etching the substrate 702 to extend the trench 800. In a particular embodiment, smoothing the inner surface can be performed using a plasma etch process including $SF_6$ gas, $C_4F_8$ gas, or a mixture thereof. In a particular embodiment, the etching gas can have a pressure in a range of approximately 5 mTorr and 10 mTorr with a gas flow rate in a range of approximately 20 sccm and 100 sccm. Etching gas can be supplied at a voltage in a range of approximately 400 V to 500 V and a power density in a range of approximately 1.0 $W/cm^2$ and 2.0 $W/cm^2$ for a period of time between approximately 10 seconds and 30 seconds.

Figure 11:
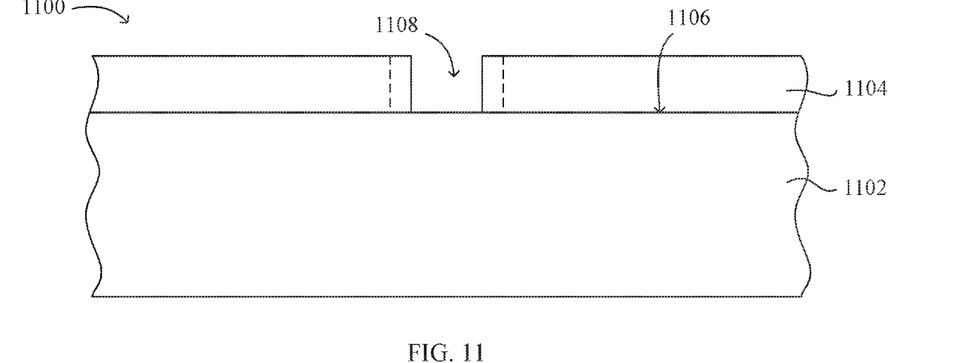
FIG. 11 includes a cross-sectional illustration of a portion of another workpiece including a substrate and a masking layer.

Referring now to FIG. 11, in another aspect, formation of a trench in a workpiece 1100 can occur by forming a masking layer 1104 over a substrate 1102, where the masking layer 1104 has an opening 1108 with a diameter less than the desired diameter of the trench. Dashed lines 1106 in the masking layer 1104 are illustrated for purpose of depicting the desired diameter of the trench to be formed in the substrate 1102. The masking layer 1104 can be generally homogenous in composition.

As illustrated, the opening 1108 in the masking layer 1104 has a diameter less than the diameter of the dashed lines 1106. In an embodiment, the diameter of the opening 1108 is no greater than 0.999 times the diameter of the desired trench, no greater than 0.99 times the diameter of the desired trench, or at no greater than 0.95 times the diameter of the desired trench. In another embodiment, the diameter of the opening 1108 is at least 0.5 times the diameter of the desired trench.

Figure 12:
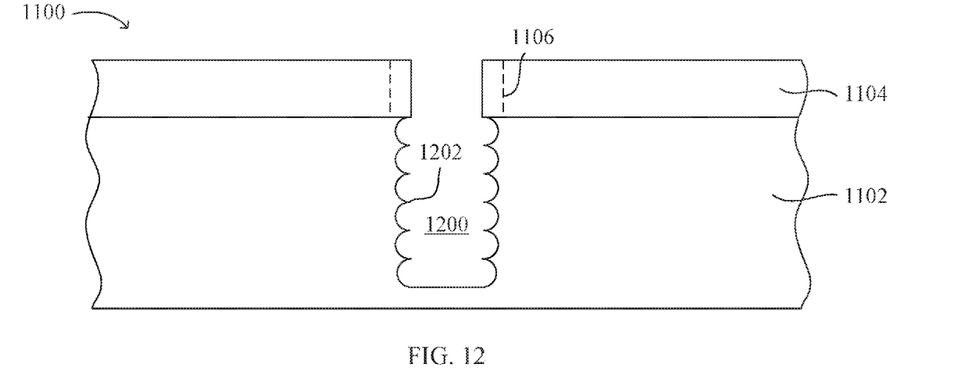
FIG. 12 includes a cross-sectional illustration of the workpiece of FIG. 11 after alternately etching and depositing polymer into the substrate to form a trench.

FIG. 12 illustrates the workpiece 1100 after formation of a trench 1200. The trench 1200 can be etched into the substrate 1102 by alternating between etching the substrate 1102 and depositing polymer into the trench 1200. Etching the substrate 1102 can be performed isotropically. In an embodiment, etching is performed using a halogen-containing gas, and in an embodiment, the halogen-containing gas does not include hydrogen. In a particular embodiment, the halogen-containing gas can include $SF_6$, $CF_4$, $NF_3$, or a mixture thereof. If needed or desired, a diluent gas, such as a noble gas, may be used. In a particular embodiment Ar may be used.

In a more particular embodiment, etching can occur at a pressure in a range of approximately 30 mTorr and 50 mTorr and a gas flow rate in a range of approximately 160 sccm and 220 sccm. Each etching step can occur for a period of time in a range of approximately 1 second and 5 seconds, in a range of approximately 1 second and 3 seconds, or in a range of approximately 1 second and 1.5 seconds.

In an embodiment, deposition of polymer into the trench 1200 is performed using an unsaturated carbon-containing gas. A partially or fully fluorinated (perfluoro) compound may be used. In a particular embodiment $C_4F_8$ gas, $C_3F_6$ gas, or a mixture thereof, may be used. When the mask layer 1104 includes photoresist, a hydrogen-containing gas may be used. An example includes $CHF_3$, $CH_3F$, or the like. If needed or desired, a diluent gas, such as a noble gas, may be used. In a particular embodiment Ar may be used.

In a more particular embodiment, deposition is performed at a pressure in a range of approximately 20 mTorr and 40 mTorr and a gas flow rate in a range of approximately 120 sccm and 150 sccm. Each deposition step can occur for a period of time in a range of approximately 1 second and 5 seconds, in a range of approximately 1 second and 3 seconds, or in a range or approximately 1.5 seconds and 2 seconds.

Formation of the trench 1200 can be performed by repeating the etching and deposition steps described above in successive cycles. In an embodiment, forming the trench requires at least 5 cycles, at least 10 cycles, at least 25 cycles, or at least 50 cycles. In another embodiment, forming the trench 400 requires less than 500 cycles, less than 200 cycles, or less than 75 cycles. The number of cycles required to form the trench 400 can depend on the etching gas and etching parameters, as well as the required depth of the trench 400 and substrate composition.

The resulting trench 1200 has a scalloped side surface 1202 similar to the side surfaces 204 and 712 discussed above. In an embodiment, step height of the scalloped features is in a range between and including 3000 Å and 9000 Å, in a range between and including 4000 Å and 8000 Å, in a range between and including 5000 Å and 7000 Å, or in a range between and including 5500 Å and 6500 Å.

Figure 13:
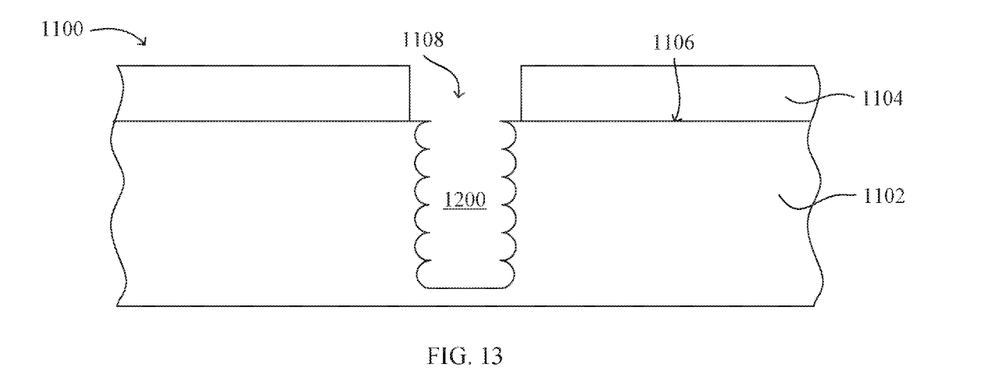
FIG. 13 includes a cross-sectional illustration of the workpiece of FIG. 12 after removing a portion of the masking layer.

After formation of the trench 1200 to the desired depth, the masking layer 1104 can be etched back to the dashed lines 1106 using an etching process. In an embodiment, the masking layer 1104 is etched using an oxide etchback by HF. The resulting device is illustrated in FIG. 13. As illustrated the width of the substrate 1102 along the major surface 1106 may be less than the width of the opening 1108 of the masking layer 1104.

Figure 14:
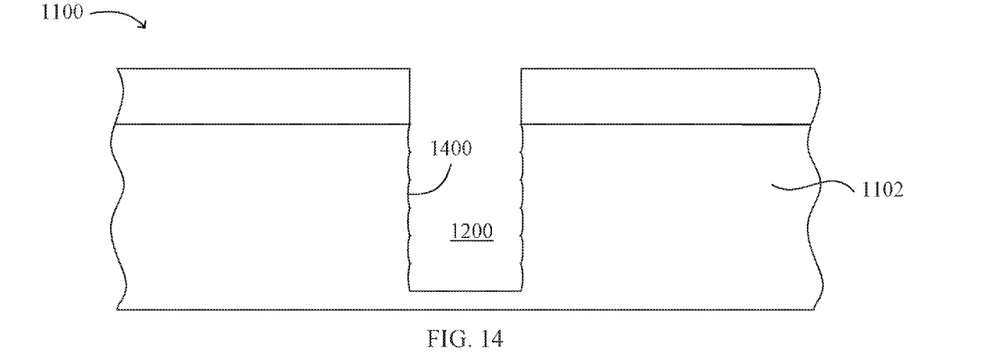
FIG. 14 includes a cross-sectional illustration of the workpiece of FIG. 13 after smoothing an inner wall of the trench.

FIG. 14 illustrates a cross-sectional view of the workpiece 1100 after smoothing the inner surface 1400 of the trench 1200. Smoothing of the inner surface 1400 can be performed anisotropically, etching the innermost tips of the scalloped features. In an embodiment, smoothing the inner surface 1400 is performed at a lower pressure than etching the substrate 1102 to extend the trench 1200. In another embodiment, smoothing the inner surface 1400 is performed at a higher voltage than etching the substrate 1102 to extend the trench 1200. In a further embodiment, smoothing the inner surface 1400 is performed at a higher voltage and a lower pressure than etching the substrate 1102 to extend the trench 1200. In a particular embodiment, smoothing the inner surface can be performed using a plasma etch process including $SF_6$ gas, $C_4F_8$ gas, or a mixture thereof. In a particular embodiment, the etching gas can have a pressure in a range of approximately 5 mTorr and 10 mTorr with a gas flow rate in a range of approximately 20 sccm and 100 sccm. Etching gas can be supplied at a voltage in a range of approximately 400 V to 500 V and a power density in a range of approximately 1.0 W/cm$^2$ and 2.0 W/cm$^2$ for a period of time between approximately 10 seconds and 30 seconds.

Figure 15:
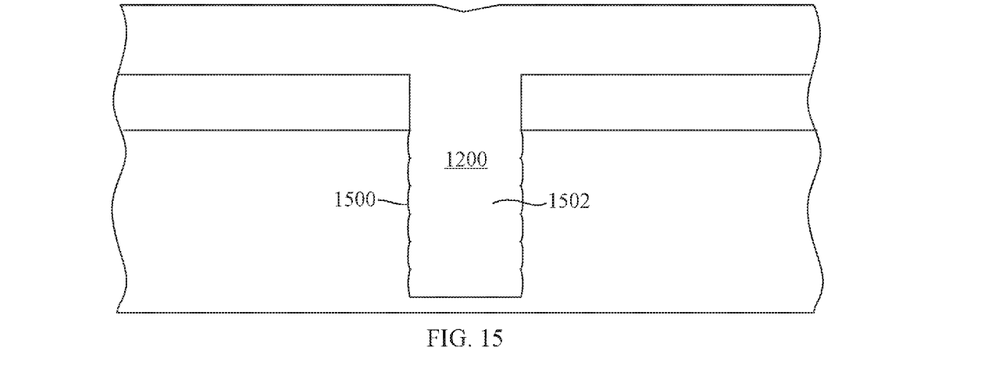
FIG. 15 includes a cross-sectional illustration of a workpiece formed using a process in accordance with an embodiment herein.

Processes described herein can generally include forming an opening at or near the major surface of a substrate, where the opening has a width less than the width of the desired trench. After the trench is formed, the opening can be increased to the desired diameter, and the trench can be smoothed to reduce the formation of voids when filling the trench with a material. FIG. 15 illustrates a trench 1500 formed in accordance with an embodiment described herein. As illustrated, material 1502 in the trench 1500 is generally homogenous and devoid of voids which might otherwise form during traditional deep trench formation processes. The reduction of voids within the material 1502 reduces undesirable electrical characteristics which might otherwise occur, for example, in the device illustrated in FIG. 1. Such electrical characteristics can result in device underperformance or failure.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A process of forming an electronic device comprising:
providing a substrate having a major surface;
etching a portion of a the substrate to define a trench extending from the major surface, wherein the portion of the trench has a first width, $W_1$, along the major surface and a second width, $W_2$, at a bottom of the portion of the trench, and wherein the first width is greater than the second width;
depositing a protective layer along side surfaces of the portion of the trench;
etching the substrate to extend a depth of the trench after depositing the protective layer; and
removing the protective layer.

Embodiment 2

The process of embodiment 1, further comprising:
smoothing an inner wall of the trench after etching the substrate to extend the depth of the trench.

Embodiment 3

The process of embodiment 2, wherein smoothing is performed at a lower pressure than etching the substrate to extend the trench.

Embodiment 4

The process of embodiment 3, wherein smoothing is performed at a higher voltage than etching the substrate to extend the trench.

Embodiment 5

The process of embodiment 1, wherein etching the substrate to extend the depth of the trench comprises alternating between:
anisotropically etching the substrate to extend the trench further into the substrate; and
depositing polymer into the trench.

Embodiment 6

The process of embodiment 5, wherein the alternating steps of etching the substrate and depositing polymer are each performed at least five times.

Embodiment 7

The process of embodiment 1, wherein the protective layer comprises a polymer.

Embodiment 8

The process of embodiment 1, wherein etching the portion of the substrate is performed such that the portion of the trench has a tapered inner wall.

Embodiment 9

The process of embodiment 1, wherein etching the portion of the substrate and depositing the protective layer are performed simultaneously during at least one point in time.

Embodiment 10

The process of embodiment 1, further comprising:
forming a mask layer over the major surface of the substrate, the mask layer defining an opening where the trench is to be formed,
wherein forming the mask layer is performed before etching the portion of the trench.

Embodiment 11

The process of embodiment 10, wherein the opening in the mask layer has a width, as seen in cross section, no less than the first width of the portion of the trench.

Embodiment 12

The process of embodiment 1, wherein etching the substrate to extend the depth of the trench is performed such that a final depth of the trench is at least 11 microns.

Embodiment 13

The process of embodiment 1, wherein $W_1$ is at least 1.01 $W_2$.

Embodiment 14

A process of forming an electronic device comprising:
providing a substrate having a major surface;
forming a patterned masking layer defining an opening having a first width;
etching the substrate to form a trench extending through the opening;
alternating:
depositing polymer into the trench; and
etching the substrate to extend a depth of the trench;
widening the opening to a second width; and
smoothing an inner wall of the trench after widening the opening.

Embodiment 15

The process of embodiment 14, wherein smoothing the inner wall of the trench is performed at a lower pressure and higher voltage than etching the substrate to extend the depth of the trench.

Embodiment 16

The process of embodiment 14, wherein smoothing the inner wall of the trench is performed after widening the opening.

Embodiment 17

The process of embodiment 14, wherein etching the substrate to extend the depth of the trench is performed such that a final depth of the trench is at least 11 microns.

Embodiment 18

A process of forming an electronic device comprising:
providing a substrate having a major surface;
forming a patterned masking layer defining an opening;
forming a sidewall spacer within the opening;
alternately:
etching the substrate to extend the trench further into the substrate; and
depositing polymer into the trench;
removing the sidewall spacer; and
smoothing an inner wall of the trench after removing the sidewall spacer.

Embodiment 19

The process of embodiment 18, wherein the sidewall spacer comprises a first material, the patterned masking layer comprises a second material, and the first material is different than the second material.

Embodiment 20

The process of embodiment 18, wherein smoothing the inner wall of the trench is performed at a lower pressure and higher voltage than etching the substrate to extend the depth of the trench.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

The invention claimed is:

1. A process of forming an electronic device comprising:
providing a substrate having a major surface;
forming a patterned masking layer including an opening having a first width $W_1$;
etching a portion of the substrate to define a portion of a trench extending from the major surface, wherein the portion of the trench has a tapered inner wall and a second width, $W_2$, at a bottom of the portion of the trench, and wherein the first width is greater than the second width;
depositing a protective layer along side surfaces of the portion of the trench;
etching the substrate to extend a depth of the trench after depositing the protective layer to form a resulting side surface having scalloped features with smaller widths that are closer to $W_2$ than to $W_1$, and larger widths that are closer to $W_1$ than to $W_2$;
removing the protective layer to expose a portion of the substrate forming an inner wall of the trench; and
smoothing a portion of the substrate forming an inner wall of the trench after etching the substrate to extend the depth of the trench such that the second width is closer to the first width after smoothing.

2. The process of claim 1, wherein smoothing is performed at a lower pressure than etching the substrate to extend the trench.

3. The process of claim 2, wherein smoothing is performed at a higher voltage than etching the substrate to extend the trench.

4. The process of claim 1, wherein etching the substrate to extend the depth of the trench comprises alternating between:
anisotropically etching the substrate to extend the trench further into the substrate; and
depositing polymer into the trench.

5. The process of claim 4, wherein the alternating steps of etching the substrate and depositing polymer are each performed at least five times.

6. The process of claim 1, wherein the protective layer comprises a polymer.

7. The process of claim 1, wherein etching the portion of the substrate and depositing the protective layer are performed simultaneously during at least one point in time.

8. The process of claim 1, wherein the portion of the trench has the first width along the major surface.

9. The process of claim 1, wherein etching the substrate to extend the depth of the trench is performed such that a final depth of the trench is at least 11 microns.

10. The process of claim 1, wherein $W_1$ is at least 1.01 $W_2$.

11. The process of claim 1, wherein $W_1$ is in a range of 1.05 to 1.4 $W_2$.

12. The process of claim 1, wherein etching the portion of a the substrate to define a portion of the trench is performed at a lower pressure and a lower voltage as compared to etching the substrate to extend a depth of the trench.

13. The process of claim 1, wherein etching a portion of a the substrate to define a portion of the trench is performed at a pressure in a range of approximately 8 mTorr and 20 mTorr, a voltage in a range of approximately 300 V to 400 V, and a power density in a range of 1.0 W/cm$^2$ and 2.0 W/cm$^2$.

14. The process of claim 13, wherein etching the substrate to extend a depth of the trench is performed at a pressure in a range of approximately 30 mTorr and 50 mTorr, a voltage in a range of 400 V to 450 V, and a power density in a range of 1.5 W/cm$^2$ to 4 W/cm$^2$.

15. A process of forming an electronic device comprising:
providing a substrate having a major surface;
forming a patterned masking layer defining an opening, wherein the patterned masking layer has a sidewall at the opening;
forming a sidewall spacer along the sidewall within the opening in the patterned masking layer to form a narrowed opening, wherein forming the sidewall spacer is performed before etching the substrate to form a trench;
forming the trench extending into the substrate below the narrowed opening, wherein forming the trench includes alternately:
etching the substrate to extend the trench further into the substrate, wherein the sidewall spacer is present along the sidewall during etching the substrate; and
depositing polymer into the trench, wherein:
forming the trench produces a scalloped side surface having scalloped features with smaller widths that are closer to a width of the narrowed opening than to a width of the opening of the patterned masking layer, and larger widths that are closer to the width of the opening of the patterned masking layer than to the width of the narrowed opening;
removing the sidewall spacer; and
smoothing an inner wall of the trench after removing the sidewall spacer.

16. The process of claim 15, wherein the sidewall spacer comprises a first material, the patterned masking layer comprises a second material, and the first material is different than the second material.

17. The process of claim 15, wherein smoothing the inner wall of the trench is performed at a lower pressure and higher voltage than etching the substrate to extend the is depth of the trench.

18. The process of claim 15, wherein etching the substrate to extend the trench is performed at a pressure in a range of approximately 30 mTorr and 50 mTorr, a voltage in a range of 400 V to 450 V, and a power density in a range of 1.5 W/cm$^2$ to 4 W/cm$^2$.

19. The process of claim 15, wherein the sidewall spacer comprises a silicon oxide material, a silicon nitride material, or a combination thereof.

* * * * *